(12) United States Patent
Ooi et al.

(10) Patent No.: US 6,984,538 B2
(45) Date of Patent: Jan. 10, 2006

(54) METHOD FOR QUANTUM WELL INTERMIXING USING PRE-ANNEALING ENHANCED DEFECTS DIFFUSION

(75) Inventors: Boon-Siew Ooi, Orefield, PA (US); Ruiyu Wang, Sunnyvale, CA (US)

(73) Assignee: Phosistor Technologies, Inc., Wheeling, IL (US)

( * ) Notice: Subject to any disclaimer, the term of this patent is extended or adjusted under 35 U.S.C. 154(b) by 24 days.

(21) Appl. No.: 10/726,384

(22) Filed: Dec. 3, 2003

(65) Prior Publication Data

US 2004/0175852 A1 Sep. 9, 2004

Related U.S. Application Data

(63) Continuation-in-part of application No. 09/916,701, filed on Jul. 26, 2001
(60) Provisional application No. 60/430,507, filed on Dec. 3, 2002.

(51) Int. Cl.
*H01L 21/00* (2006.01)
*H01L 21/324* (2006.01)

(52) U.S. Cl. .............................. 438/22; 438/36; 438/522
(58) Field of Classification Search ............ 438/22–47, 438/479–509, 518–523
See application file for complete search history.

(56) References Cited

U.S. PATENT DOCUMENTS

| | | | | |
|---|---|---|---|---|
| 5,395,793 A | * | 3/1995 | Charbonneau et al. | 438/797 |
| 6,632,684 B2 | * | 10/2003 | Marsh et al. | 438/7 |
| 6,674,778 B1 | * | 1/2004 | Lin et al. | 372/46 |
| 2002/0030185 A1 | * | 3/2002 | Thompson et al. | 257/14 |
| 2002/0072142 A1 | * | 6/2002 | Ooi et al. | 438/46 |
| 2003/0096509 A1 | * | 5/2003 | Dubowski | 438/796 |
| 2004/0038503 A1 | * | 2/2004 | Fu et al. | 438/511 |
| 2004/0106224 A1 | * | 6/2004 | Hamilton et al. | 438/31 |

OTHER PUBLICATIONS

Yamada et al, "Strained InGaAs/GaAs a single quantum well lasers with saturable absorbers fabricated by quantum well intermixing"Appl.Phys.Lett.60(20)May 18, 1992, pp2463–2465.*
Piva et al,"Bandgap tuning semiconductor quantum well structure using ion implantation"Superlattice and Microstructures vol. 15 n0. 15, 1994 pp385–389.*
Labrie et al, Effects of low temperature preannealing on ion–implant assisted intermixing of SiGe/Si quantum wells, Appl. Phys. Lett 69(25)Dec. 16, 1996.*
Effects of dopants in the spin–on glass layer on the bandgap shift in GaAs/AlGaAs and InGaAs/AlGaAs intermixed quantum wells, IEEE pp. 145–148.*
Goldberg et al,"Ion Beam intermixing of Semicondcutor heterostructures for optoelectronic Aplpications" Nuclear Instrument and Methods inPhysics Research B (127/128(1997)pp418–422.*

* cited by examiner

*Primary Examiner*—Savitri Mulpuri
(74) *Attorney, Agent, or Firm*—Brinks Hofer Gilson & Lione

(57) ABSTRACT

A process for shifting the bandgap energy of a quantum well layer (e.g., a III-V semiconductor quantum well layer) without inducing complex crystal defects or generating significant free carriers. The process includes introducing ions into a quantum well structure at an elevated temperature, for example, in the range of from about 200° C. to about 700° C. The quantum well structure that has had ions introduced therein includes upper and lower barrier layers with quantum well layers therebetween. The quantum well structure is then pre-annealed at a temperature and time that does not induce quantum well intermixing, but does diffuse the point defects closer to the quantum well layer. Finally, the structure is thermally annealed at a higher temperature to induce quantum well intermixing (QWI) in the quantum well structure, which shifts the bandgap energy of the quantum well layer.

33 Claims, 9 Drawing Sheets

METHOD FOR QUANTUM WELL INTERMIXING USING PRE-ANNEALING ENHANCED DEFECTS DIFFUSION

This application claims the benefit of the filing date under 35 U.S.C. §119(e) of Provisional U.S. patent application Ser. No. 60/430,507, filed on Dec. 3, 2002, which is hereby incorporated by reference in its entirety; this application also claims priority as a continuation-in-part of appl. Ser. No. 09/916,701, entitled "Methods of Shifting the Bandgap Energy of a Quantum Well Layer," filed Jul. 26, 2001, which is hereby incorporated by reference in its entirety.

FIELD OF THE INVENTION

This invention relates to semiconductor photonic and opto-electronic devices, and more particularly to a bandgap tuning method for manufacturing such devices.

BACKGROUND OF THE INVENTION

In the manufacturing of photonic devices, it is often desirable to employ processes that facilitate the monolithic integration of multiple photonic devices on a single substrate. This monolithic integration increases the yield, performance and functionality of the photonic devices and reduces manufacturing cost. The multiple photonic devices can include active photonic devices (e.g., lasers, optical intensity modulators, optical phase modulators, optical switches, optical amplifiers, optical saturable absorbers, optical pulse reconditioners, optical wavelength converters, photon transistors, variable optical attenuators, optical detectors, etc.) and passive photonic devices (e.g., optical waveguides, optical gratings and optical splitters, optical beam couplers, multi-mode interference devices, optical polarizers, optical polarization beam splitters, optical wavelength filters, optical resonators, etc.).

Photonic devices can be made of III-V semiconductor materials. Monolithic integration of multiple photonic devices, however, usually requires that photonic devices with different III-V semiconductor material characteristics (e.g., different bandgap energies) be formed on a single substrate. For example, to monolithically integrate a photonic laser device and a passive optical waveguide device, the photonic laser device must contain active III-V semiconductor materials that emit light at a particular lasing wavelength, while the passive optical waveguide device must contain passive III-V semiconductor materials that are transparent to the light emitted from the photonic laser device. Therefore, the emission/absorption wavelength of the III-V semiconductor materials in the photonic laser device must be different from that of the III-V semiconductor materials in the passive optical waveguide device.

The emission/absorption wavelength of III-V semiconductor materials is determined by their bandgap energy. Thus, monolithically integrating multiple photonic devices on a single substrate requires a process for shifting the bandgap energy (and thus the bandgap wavelength) of a selected substrate portion to a value different from that of another substrate portion. Such a process is often referred to as "bandgap engineering."

The fabrication of photonic integrated circuits requires a robust process that is capable of high spatial bandgap selectivity across a wafer, while producing little or insignificant change in both optical and electrical properties of the processed material.

Currently, photonic integration methods use epitaxial growth and re-growth. Selective area epitaxy technology, however, adds additional etching and/or manufacturing steps, and thus produces relatively low production yield to the final device. Further, such methods are not planar processes, and integration of multiple photonic elements using these complex techniques is therefore complicated.

Another approach to bandgap engineering is called "Quantum Well Intermixing (QWI)." See for example: U.S. Pat. No. 4,871,690, issued to N. Holonyak, Jr. et al. in October 1989; J. H. Marsh, "Quantum Well Intermixing," Semicon. Sci. Tech, 8, 1136, 1993; and N. Holonyak, Jr, "Impurity Induced Layer Disordering of Quantum Well Heterostructures: Discovery and Prospects," IEEE. J. Sel. Topic. Quantum. Electron, 4, 584, 1998. Photonic devices typically have a quantum well (QW) structure that includes a quantum well layer disposed between (i.e., sandwiched between) two barrier layers. The barrier layers have a larger bandgap energy than the quantum well layer and act as a potential barrier to confine electrons in the quantum well layer. QWI shifts the bandgap energy of a quantum well layer in selected areas by intermixing (also called interdiffusing) the atoms between the quantum well layer and its adjacent barrier layers.

The mechanisms of QWI, especially for two phase intermixing processes in a quaternary compound semiconductor, are not fully understood. It is commonly accepted that as point defects or impurities are diffused into the active quantum well structure, which enhances the intermixing rate between the well and the barrier regions, the bandgap of the active well region is shifted to a higher energy.

Several techniques have been found to induce quantum well intermixing (QWI) in III-V quantum well structures. These techniques are impurity induced disordering (IID) (those skilled in the art know that 'disordering' is used interchangeably with the terms 'interdiffusion' or 'intermixing'), impurity free vacancy diffusion (or disordering), thin film encapsulant induced group-III vacancy techniques, and laser irradiation induced disordering (including photo-absorption induced disordering and pulsed-photo-absorption induced disordering). There are advantages and disadvantages for each of these post-growth quantum well intermixing techniques.

Impurity Induced Disordering (IID) involves the creation of crystal site vacancies (i.e., point defects). As is well known to those skilled in the art, the atoms in a semiconductor material form a crystal structure and are arranged in a periodic lattice-like fashion. In the case of III-V semiconductor materials, two types of atoms, namely the group III atoms and the group V atoms, are arranged to occupy alternating lattice sites in the crystal structure. These group III and group V atoms exchange electrons and exist as electrically charged ions at the lattice sites. In the case of Aluminum Gallium Arsenide (AlGaAs), the Al and Ga atoms are from group III and the As atom is from group V. In the case of Indium Gallium Arsenide Phosphide (InGaAsP), the In and Ga atoms are from group III and the As and P atoms are from group V. A "crystal site vacancy" is formed when an ion is missing from a lattice site. Such a crystal site vacancy can be formed, for example, by knocking an ion off its site to an "interstitial space" in the crystal structure. A single isolated vacancy or a small group of vacancies is called a "point defect." A point defect carries the opposite electric charge of the missing ion.

A point defect can move around in the crystal structure when the crystal structure is heated. Heating can cause the atoms in the sample to vibrate violently. Under such thermal vibration, an atom from a lattice site close to the vacancy may move into the vacancy and fill the vacancy (i.e., void). The original site of the atom then forms a new vacancy or point defect, resulting in an effective movement of the point defect from one lattice site to another. Before this type of QWI can happen, point defects are either created at the quantum well structure or migrated to the quantum well structure (for example, to the boundary between a quantum well layer and a barrier layer) via a thermal process.

After the above-mentioned process of having the point defects at the boundary between the quantum well layer and a barrier layer, a subsequent high-temperature crystal annealing step is needed to cause quantum well intermixing (QWI) to occur. Upon high temperature annealing, thermal energy causes some of the point defects in the barrier layer to be filled by atoms from the quantum well layer and some of the point defects in the quantum well layer to be filled by atoms from the barrier layer. In addition, some of the interstitial atoms with opposite charge will also migrate down to meet with some of the vacancies and heal (i.e., fill) the vacancies. On the other hand, some of the vacancies will migrate deep down to the substrate and become diluted out. In short, this annealing process causes an effective exchange (or "intermixing") of the atoms between the quantum well layer and the barrier layer(s), resulting in a shift of the bandgap energy to a higher value.

In a conventional IID process, the creation of the crystal site vacancies (i.e., point defects) is typically accomplished by introducing impurity atoms/ions into the quantum well structure using a room temperature ion-implantation technique. The ion implantation step is followed by a high temperature anneal step, typically conducted at a temperature of around 800° C. for a GaAs and AlGaAs based quantum well structure, or around 600° C. for an InGaAs and InGaAsP based quantum well structure. In such a conventional IID process, donor ion species (e.g., Si) and acceptor ion species (e.g., Zn) have been utilized. These donor and acceptor ion species are known as shallow-level ion species, because they have a relatively low energy of ionization in III-V material semiconductors. During the high temperature anneal step, some of the point defects created by the implanted atoms/ions, the interstitial ions (i.e., those ions knocked from their lattice sites) and the implanted atoms/ions, will diffuse into the quantum well layer and barrier layers and promote QW intermixing between atoms in the quantum well layer and the barrier layers.

The use of high-energy and/or high dose (i.e., a dose of greater than $1 \times 10^{15}$ cm$^{-2}$) ion implantation in conventional IID processes is known, however, to cause severe damage in the quantum well structure. The more severe damage includes crystal defects known as loops, lines, complexes and clusters. In general, these crystal defects are referred to as "complex defects."

Conventional ion implantation based IID processes have several drawbacks. These drawbacks include difficulty in producing: (i) a low-loss waveguide photonic device due to free carrier absorption from implanted shallow-level ion species and scattering loss from complex defects induced by the IID process; (ii) photonic devices with controlled electrical characteristics (e.g., a desirable electrical conductivity or pn-junction properties) due to the aforementioned free carriers and complex defects, as well as re-distribution of dopants during the high temperature anneal step; and (iii) a photonic device with a high quality gain layer due to the IID process-induced complex defects, which create carrier recombination centers, resulting in shorter carrier lifetime and lower optical gain.

Active or passive photonic devices such as amplifiers, lasers, detectors, modulators, couplers, transparent waveguides, and many others, require either good electrical conductivity, low waveguide loss, or high optical gain. Another fundamental issue in QW shape modification is the reliability, reproducibility, and simplicity of the spatial selective QWI process. Moreover, QWI tends to damage semiconductor materials, resulting in high waveguide loss and poor material quality. For example, known impurity induced disordering (IID) processes typically use neutral impurity, high-energy ion implantation with a relatively high dose.

The implantation energy tends to be at the MeV level. QW structures intermixed using this technique suffer a certain amount of damage, and hence are characterized by high loss to the passive waveguide sections. See for example J. J. He, et al., 'Bandgap Shifted InGaAs/InP Quantum Well Waveguides Using MeV Ion Implantation,' Electronics Letters, vol 31(24), pp 2094, 1995. This material damage shortcoming imposes a limitation on the fabrication of high performance photonic and opto-electronic integrated circuits. Because QWI results in high waveguide loss, this process has historically been used to fabricate devices with relatively short passive waveguide lengths. Further, as the quality of the material is degraded after the intermixing process, this semiconductor material cannot be used to make active devices such as wavelength shifted lasers, modulators or detectors. This reduces the flexibility of device design and the number of devices that can be integrated on a single chip.

In order to address the above process issues, an improved QWI technique based on thermal assisted implantation vacancy induced disordering (TAIVID) has been developed, as disclosed in co-pending U.S. patent application Ser. No. 09/916,701 entitled Method For Shifting the Bandgap Energy of a Quantum Well Layer, which is expressly incorporated herein by reference. This technique is based upon impurity induced disordering (IID) because of its process simplicity and its ability to produce high bandgap and spatial selectivity in InGaAs/InGaAsP quantum well structures. Briefly, this process utilizes in-situ heating (i.e. an elevated temperature) during an ion implantation step to spread out the spatial distribution of the point defects created during ion implantation, followed by an anneal step to induce QWI. To minimize the material damage, this process is carried out using an impurity that is electrically neutral to the material system, at a lower implantation energy, and using a relatively low implant dose. This process reduces the formation of complex crystal defects, and thus retains high material quality with low material loss in the QW structure (e.g. formed of III-V semiconductor materials) after intermixing. Active devices such as wavelength-tuned lasers having been produced using this technique. There was an insignificant change in the threshold current of such lasers relative to As-grown lasers, implying that the material quality remains high after quantum well intermixing using this technique.

While this improved QWI process has been proven to induce a large degree of QWI for InGaAs/InGaAsP lattice matched QW structures, it has been shown to give quite low reproducibility in modifying the bandgap of InGaAs/InGaAsP based strained (compressive and/or tensile) QW structures. There has been a great deal of interest in strained InP-based QW systems for their commercial potential in polarization insensitive devices such as semiconductor optical amplifiers (SOA) and modulators.

SUMMARY OF THE INVENTION

The present invention is an improved process technology that involves ion implantation, pre-anneal and anneal steps to induce enhanced defects diffusion disordering in both lattice matched and strained quantum well structures, which addresses the issue of quantum well strain relaxation, and hence makes the integration of low polarization sensitive devices such as semiconductor optical amplifiers and modulators possible using the quantum well intermixing approach.

The method of shifting a bandgap energy of a semiconductor quantum well layer includes the steps of introducing ions into a quantum well structure at a first elevated temperature, wherein the quantum well structure comprises a plurality of material layers formed on a semiconductor substrate including a quantum well layer disposed between an upper barrier layer and a lower barrier layer, thermally pre-annealing the quantum well structure at a second elevated temperature and for a pre-anneal time period that do not induce quantum well intermixing in the quantum well structure, and thermally annealing the quantum well structure at a third elevated temperature and for an anneal time period sufficient to induce quantum well intermixing in, and a shifting of a bandgap energy of, the quantum well layer.

In another aspect of the present invention, the method of making a multiple bandgap semiconductor device includes the steps of forming a quantum well structure, wherein the quantum well structure comprises a plurality of epitaxial layers disposed over a substrate including a quantum well layer disposed between upper and lower barrier layers, forming a patterned mask over the quantum well structure with sufficient thickness to block ions incident thereon, wherein the patterned mask includes a plurality window portions of reduced thickness for passing therethrough at least some ions incident thereon, heating the quantum well structure to a first elevated temperature, bombarding the patterned mask with ions, wherein at least some of the ions incident on the window portions pass therethrough and are introduced into the heated quantum well structure, thermally pre-annealing the quantum well structure at a second elevated temperature and for a pre-annealing time period that do not induce quantum well intermixing in the quantum well structure, and thermally annealing the quantum well structure at a third elevated temperature greater than the second elevated temperature, and for an anneal time period sufficient to induce quantum well intermixing in, and a shifting of a bandgap energy of, the quantum well layer.

Other systems, methods, features, and advantages of the invention will be or will become apparent to one skilled in the art upon examination of the following figures and detailed description. All such additional systems, methods, features, and advantages are intended to be included within this description, within the scope of the invention, and protected by the accompanying claims.

DETAILED DESCRIPTION OF THE PREFERRED EMBODIMENTS

Figure 1:
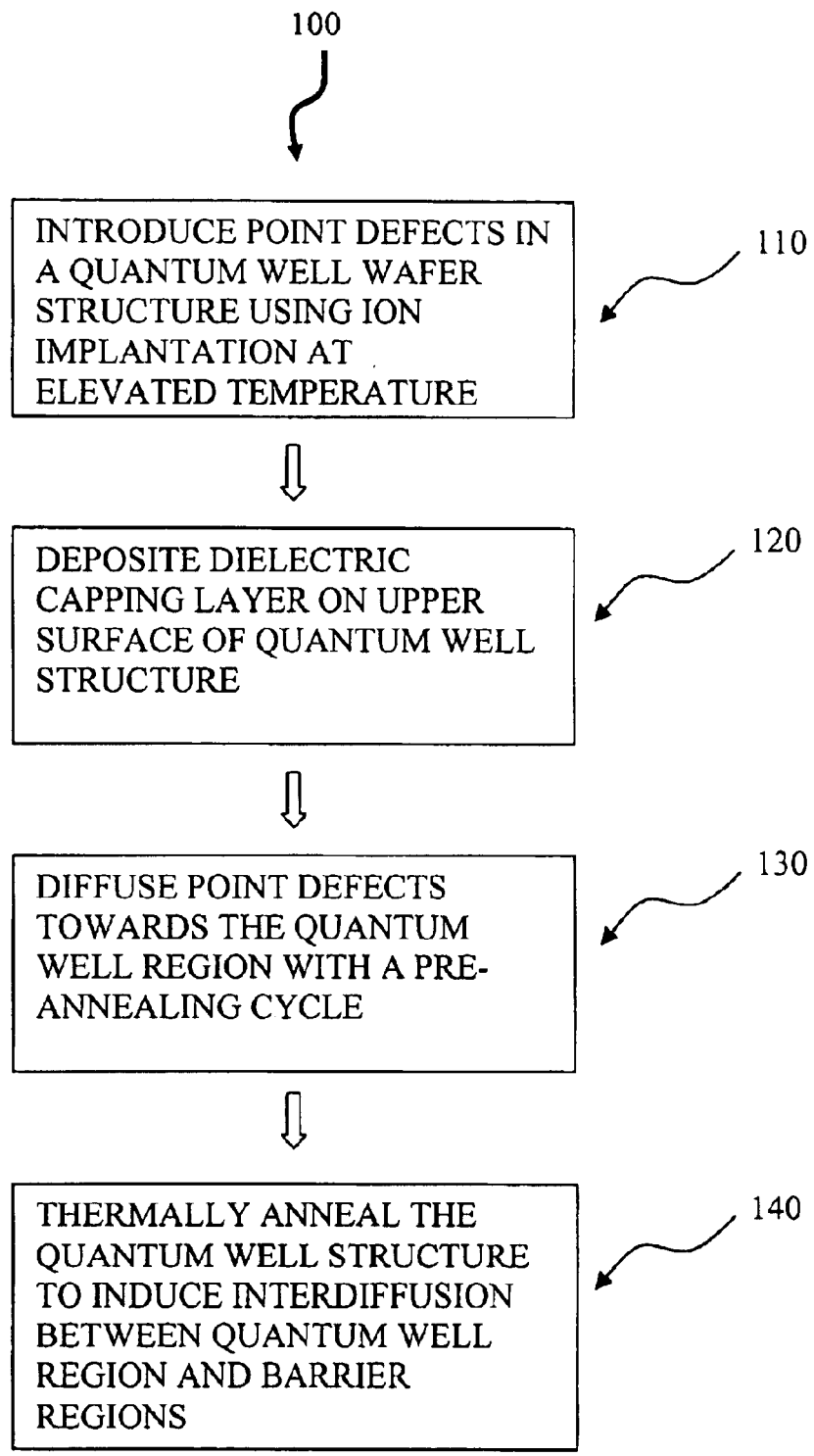
FIG. 1 is a process flow diagram, illustrating the quantum well intermixing steps of the present invention.

The present invention is a method of selectively modifying/tuning/engineering the bandgap of quantum well hetero-structures (which can include single quantum wells, multiple quantum wells and/or superlattices) for photonic device integration. FIG. 1 illustrates the basic process flow 100 of the present invention, which includes: (i) introducing point defects in a quantum well wafer structure at an elevated temperature (step 110), (ii) depositing a dielectric capping layer on an upper surface of the quantum well structure (step 120), (iii) diffusing the point defects toward the quantum well region with a pre-annealing heating cycle (step 130), and (iv) thermally annealing the quantum well structure to induce quantum well intermixing (QWI) between the quantum well and barrier regions (step 140).

Quantum Well Structure

The bandgap tuning method of the present invention can be used to spatially control the bandgap of a p-n junction, a p-i-n junction, or an undoped layer where the active region consists of a quantum well structure such as a single quantum well, a multiple quantum well, or a superlattice structure for the fabrication of photonic and opto-electronic integrated circuits. The quantum well structure can be lattice matched, or strained (i.e., compressive and/or tensile). This technique can also be used to partially tune or modify the bandgap of the quantum well structure to fabricate bandgap tuned discrete devices such as semiconductor lasers, amplifiers, modulators, detectors, solar cells, etc.

Figure 2:
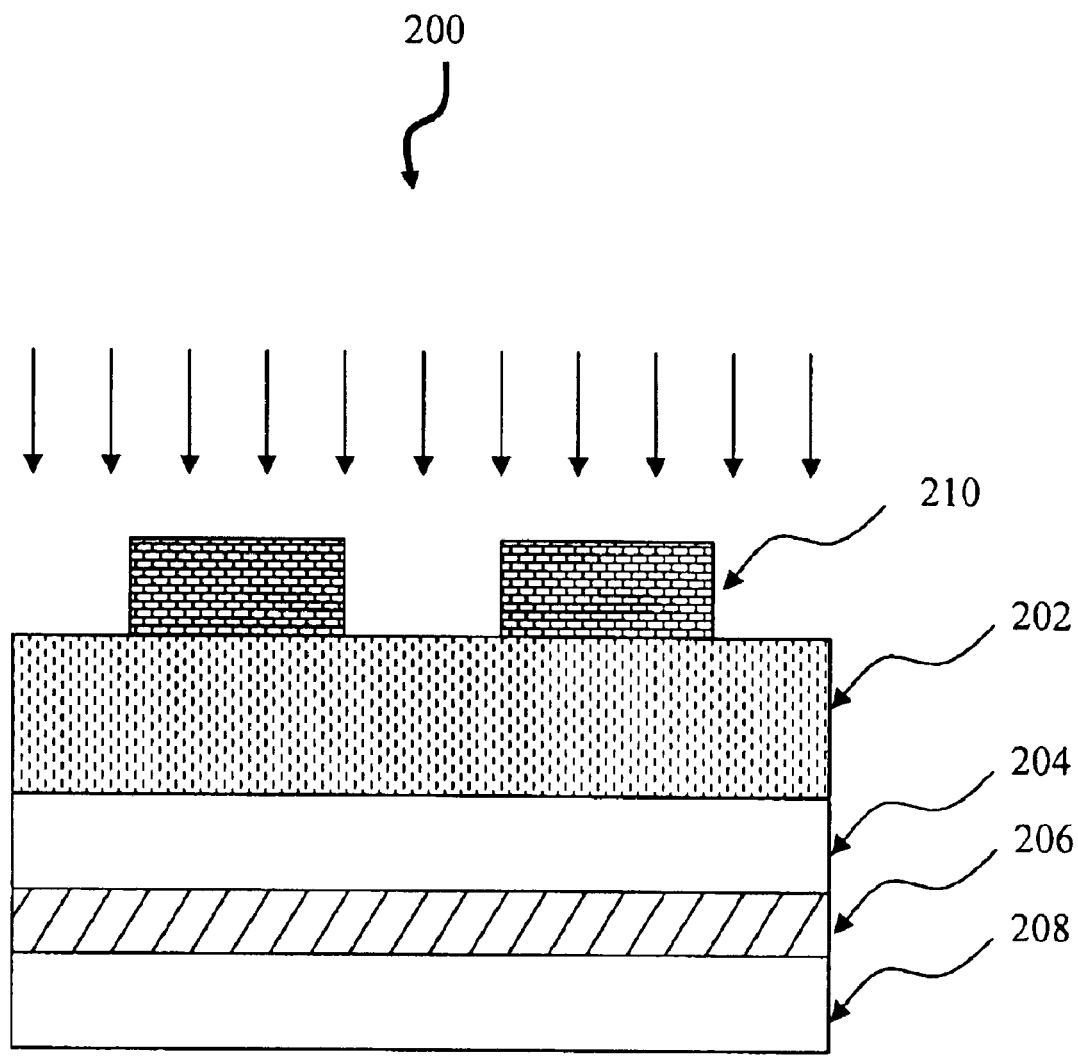
FIG. 2 is a cross sectional view illustrating ion implantation on a quantum well structure.

FIG. 2 illustrates an example quantum well (QW) structure 200 on which the bandgap tuning method of the present invention can be applied. The QW structure 200 includes an upper cladding layer 202, an upper barrier layer 204, a quantum well layer 206, and a lower barrier layer 208, all formed on a semiconductor substrate (not shown). Quantum well layer 206 is disposed between (i.e., sandwiched between) upper barrier layer 204 and the lower barrier layer 208. Upper barrier layer 204, quantum well layer 206 and lower barrier layer 208 can be formed of any suitable III-V semiconductor material known to one skilled in the art, where the bandgap energy of barrier layers 204/208 is greater than that of the quantum well layer 206. For example, upper barrier layer 204 and lower barrier layer 208 can be formed of InGaAsP (or, alternatively, InP) and quantum well layer 206 can be formed of InGaAs (or, alternately, InGaAsP). Alternatively, upper barrier layer 204 and lower barrier layer 208 can be formed of AlGaAs, AlGaInAs, AlGaInP, or GaAsP and quantum well layer 206 can be formed of GaAs, AlGaAs, AlGaInAs, AlGaInP, or GaAsP. In addition, processes in accordance with the present invention can be employed with a quantum well structure that includes a plurality of quantum well layers (e.g., multiple stacked quantum well and barrier layers).

A typical thickness for quantum well layer 206 is in the range of a few angstroms to about 120 angstroms. A typical thickness for upper barrier layer 204 and lower barrier layer 208 is in the range of a few angstroms to 250 angstroms or thicker. The cladding layer 202 can be made of InP or InGaAsP, etc., and typically (but not necessarily) has a thickness of at least 1 µm.

A patterned mask layer 210 may also be formed on the quantum well structure. The patterned mask layer 210 serves as an implant mask, with portions thereof either completely blocking ions from penetrating into the quantum well structure, by limiting the degree to which ions penetrate into the quantum well structure, or by allowing the ions to pass therethrough unhindered. By predetermining the thickness (es) of the patterned mask layer portions, one can also control the amount of impurity ions implanted into the quantum well structure and thus control the degree of bandgap energy shift in different portions of the quantum well layer. The use of a patterned mask layer, especially one with multiple thicknesses for creating different concentrations of point defects for different quantum well layer portions, enables the monolithic integration of multiple photonic devices possessing different bandgap energies.

Patterned mask layer 210 can be formed of silicon dioxide ($SiO_2$), or any other material that selectively prevents the penetration of ions into the quantum well structure, such as silicon nitride, aluminum, titanium, nickel, chromium, photo resist, polymer, PMMA (poly-methyl methyl-methacrylate), zinc oxides, strontium fluoride, metals or semiconductors, using conventional deposition, photolithographic and etching techniques. The thickness of patterned mask layer is dependent on the mass and energy of the ion being implanted and the degree of desired penetration (if any) of the ions into the quantum well structure (e.g., a 900 nm thick $SiO_2$ patterned mask layer has been used to completely block ion implantation).

A patterned stress-inducing mask layer can be used during the ion implantation step to improve the spatial selectivity during QWI. In this process, the mask layer material has a thermal expansion coefficient that is significantly different from that of the quantum well structure material on which the patterned stress-inducing mask layer is formed. The difference in thermal expansion coefficient allows significant stress to be created to form vertical stress field lines that aid in guiding the migration of point defects to the quantum well structure during the thermal annealing step. The vertical stress field lines enable the achievement of high spatial resolution so that an area of bandgap energy shift is located within 3 microns of a boundary defined by an edge of the patterned stress-inducing mask layer. For the purpose of illustration and not limitation, the material of the patterned stress-inducing mask layer can be silicon dioxide, high stress silicon nitride, and other insulators, metals, or semiconductor materials that can form high stress field lines at the boundary defined by an edge of the stress-inducing patterned mask layer. For example, silicon dioxide can be employed as the material of the patterned stress-inducing mask layer since silicon dioxide has a thermal expansion coefficient that is more than 10 times different than that of typical III-V semiconductor materials.

Further aspects of the quantum well structure 200, and implantation/anneal processing thereon, are described in co-pending U.S. patent application Ser. No. 09/916,701 entitled Method For Shifting the Bandgap Energy of a Quantum Well Layer, which is expressly incorporated herein by reference.

Step 1: Native Point Defects Introduction

The method steps of the present invention shown in FIG. 1 are now described in detail. Ion implantation step 110 is graphically shown by the arrows in FIG. 2. A primary function of the ion implantation step 110 is to generate point defects in the quantum well structure 200 (e.g., in the cladding layer 202). The ion species used in ion implantation step 110 can be any suitable shallow-level ion species (e.g., Si, Zn, Be, Ge, Sn and S) or deep-level ion species (e.g., B, F, Ga, As, P, Xe, N, O and Ar) known to one skilled in the art. However, since deep-level ion species are not easily ionized at room temperature, their use provides the additional benefit of reducing the free carrier concentration in quantum well structure 200, in comparison to the use of shallow-level ion species. Further, such a reduction of free carrier concentration with the use of deep-level ion species also lowers optical loss in waveguides manufactured from quantum well structure 200. With the quantum well structure shown in FIG. 2, the ions penetrate into, and create point defects in, the cladding layer 202. If the ion implantation energy is great enough, the ions also penetrate into, and create point defects in, the upper barrier layer 204 as well.

Arsenic (As), gallium (Ga), phosphorus (P) and Xenon (Xe) are especially beneficial deep-level ion species for use in the process. Arsenic and phosphorus are matrix elements of III-V semiconductor materials and are expected to recombine with other constituent elements in quantum well structure 200 to form part of the lattice during a subsequent thermal annealing step. Arsenic, gallium and phosphorus are also expected to carry no charge state and, therefore, are not expected to contribute to undesirable free carrier absorption at room temperature. Xenon is also especially beneficial since it has a relatively large atomic mass (i.e., 132) and is, therefore, expected to exhibit a low lateral straggle length (i.e., lateral penetration into the substrate) during ion implantation step 110, and to create a high concentration of point defects. In addition, since the diffusion coefficients of As, P and Xe in III-V semiconductor materials are relatively low, ion diffusion induced QWI in the undesirable lateral direction is expected to be minimal.

Residual damage and extended defects, such as loops, lines, complexes, and dislocations, might be formed if a high concentration of impurity/point defects is introduced into the QW structure material using high-energy ion implantation. Known ion implantation processes for IID commonly use an implant-energy of a few hundred keV to around 1 MeV with an implantation dose of ~$10^{15}$ cm$^{-2}$. These implant conditions are deemed required to drive the impurity closer to the quantum well layer 206 to create a large enough defect concentration so that impurity and point defects need only travel a shorter distance to reach the QW layer 206 during the rapid anneal process.

To avoid the formation of defect clusters, which will degrade the quality of the semiconductor materials, the ion implantation step used with the present invention is performed at an implantation dose less than $10^{15}$ cm$^{-2}$ at an implant-energy not exceeding 360 keV. To avoid the formation of complexes, this implantation step should be carried out at an elevated temperature. Beneficial effects of heating the quantum well structure during ion implantation begin around 100° C., but better results are achieve with an implant temperature within the approximate range of 200° C. to 600° C. The heated structure, in combination with an implantation dose below $10^{15}$ cm$^{-2}$, spreads out the spatial distribution of point defects generated during the ion implantation, which maintains the point defect concentration below the critical CDF concentration for the formation of complex defects. The avoidance of such complex defects helps to reduce optical loss and gain deterioration in the quantum well structure. To eliminate free carrier absorption, neutral species such as As, P, Ar, Xe, etc, are preferred in this process.

In addition to avoiding the formation of complex defects, the in-situ heating serves to diffuse point defects closer to quantum well layer 206. As a result, such in-situ heating provides a reduction of the ion dose and implantation energy needed to induce QWI in the subsequent thermal anneal step. An in-situ heating temperature of approximately 200° C. is close to the minimum temperature needed to impart enough energy to cause substantial thermal diffusion of the point defects. The upper temperature limit of in-situ heating is dependent on the temperature at which the III-V semiconductor material begins to thermally decompose. For InP/InGaAs/InGaAsP type materials, the decomposition occurs above 750° C. For GaAs/AlAs/AlGaAs type materials, the decomposition occurs above 950° C.

Once apprised of the current disclosure, one skilled in the art will recognize that the introduction of ions according to the present invention is not limited to the above described ion implantation, but can be accomplished via any known ion bombardment method that introduces ions into the quantum well structure to induce point defects therein. Such ion introducing techniques include ion implantation, focused ion beam irradiation, plasma sputtering, electron beam irradiation, laser ablation, dielectric cap induced group III outdiffusion, etc. A focused ion beam can be furnished by a focused ion beam machine. A dense ion plasma can be furnished by an inductively-coupled plasma (ICP) machine, a reactive-ion-etching (RIE) machine, or a plasma-enhanced chemical vapor deposition (PECVD) machine. One skilled in the art will also recognize that the temperature range of in-situ heating may be away from the preferred range of 200° C. to 600° C., depending on the material structures and the degree of diffusion desired for the point defects.

Step 2: Annealing Cap Deposition

The implantation mask 210 is removed after the ion implantation. To minimize the out-diffusion of Group V elements in a III-V semiconductor (e.g., As and P) during high temperature annealing, the surface of the quantum well structure 200 is preferably coated with a layer of dielectric encapsulant material (e.g., SiO$_2$, Si$_2$N$_4$, etc). This layer is formed, for example, by using a plasma-enhanced chemical vapor deposition (PECVD) technique with a typical thickness of approximately 200 nm.

Step 3: Pre-annealing Enhanced Point Defects Diffusion

A pre-annealing thermal process is next performed on the quantum well structure, which can be carried out, for example, in a diffusion furnace or a rapid thermal processor. This pre-annealing cycle is a low impact anneal process with pre-anneal conditions (i.e., temperature and time) that are below the minimum activation energy in the quantum well structure sufficient to induce quantum well intermixing (QWI) therein. The minimum anneal conditions necessary to cause QWI will vary depending on the material used to form the quantum well structure, as well as the dosage and energy of the implanted ions. For any given material implanted with ions, the minimum anneal conditions necessary to cause QWI can be experimentally determined by increasing the anneal temperature and/or time until a significant shift (i.e., exceeding approximately 20 nm) occurs in the photoluminescence spectra of the quantum well structure, which indicates that the bandgap energy of the quantum well layer has been increased through QWI. As an example, for a lattice matched InGaAs/InGaAsP quantum well structure, implanted with $10^{14}$ cm$^{-2}$ doubly charged phosphorous at 360 keV, pre-anneal conditions of 600° C. for 10 minutes has been shown to not reach the minimum activation energy in the quantum well structure sufficient to cause QWI.

The pre-annealing thermal cycle temperature is preferably, but not necessarily, about 50° C. below the epitaxial growth temperature for the structure. For instance, a pre-annealing thermal cycle temperature of 600° C. can be used for InGaAs/InGaAsP structures, where the typical metal-organic chemical vapor deposition (MOCVD) growth temperature is about 650° C.

Under thermal cycle conditions that do not reach the minimum activation energy in the quantum well structure for QWI, the bandgaps of both implanted and non-implanted quantum well regions have been found to not exhibit any significant bandgap shift. Similarly, the doping profiles (both p- and n-types) are not expected to alter significantly under these thermal cycle conditions. For most III/V quantum well structures, a minimum pre-anneal temperature of approximately 300–400° C. is necessary to drive the point defects deeper into the quantum well structure, and a maximum pre-anneal temperature of approximately 600–650° C. is desirable to avoid causing QWI during the pre-anneal process. The time for this pre-anneal thermal cycle can vary from a few minutes to a few tens of minutes, depending upon the structure material, ion implantation, and the thermal cycle temperature.

The preferred purge gas for a rapid thermal processor (RTP) system used for the pre-anneal thermal cycle is nitrogen (N$_2$), and the RTP is preferably, but not necessarily, equipped with a lamp array for the heating element, and a cold-wall, gold-coated reflective chamber. To further reduce the out-diffusion of group V elements (i.e., As and P for III-V semiconductors), the quantum well structure is preferably pre-annealed under a group V, overpressure ambient (e.g., arsenic). This is achieved by sandwiching the quantum well structure between two pieces of GaAs wafer.

The pre-annealing cycle drives the point defects generated by ion-implantation closer to and possibly even into the quantum well layer 206, without activating quantum well intermixing. Although the mechanisms are still under investigation, it has been experimentally found that this pre-annealing cycle is an important step for the intermixing of the strained quantum well structures, especially tensile strained quantum well structures.

Step 4: QWI Anneal Stage

The fourth and final step is to anneal the quantum well structure with anneal conditions that exceed the minimum activation energy in the quantum well structure for QWI, hence modifying the bandgap energy of the quantum well layer 206 via quantum well intermixing (interdiffusion). This annealing step can be performed using a conventional furnace, electric oven, a rapid thermal processor, or any other heating or annealing system. To minimize group V outdiffusion, the annealing process is also carried out, preferably, under a group V (e.g., Arsenic) over-pressure condition.

The thermal annealing step heats the quantum well structure up to, and maintains it at, an anneal temperature for a predetermined anneal time, and then cools the quantum well structure down to room temperature. The QW structure temperature may take step wise or arbitrarily changing profiles during the anneal process, though a steadily raising profile to a near constant maximum temperature, followed by steadily cooling profile to room temperature, is the most straight forward anneal process. For the purpose of illustration and not limitation, the thermal annealing step can last for a period of several seconds to approximately 5 minutes. A shorter thermal annealing time has the benefit of reducing surface decomposition.

During high temperature annealing, surface point defects generated by ion implantation will either relax at a surface or indiffuse into a QW structure. As described above, as the point defects indiffuse into the QW structure, some of the point defects in the barrier layers 204/208 will be filled by atoms from the quantum well layer 206, and vice versa. Such intermixing between the atoms of the QW and barrier layers, referred to as the quantum-well-intermixing or quantum-well-interdiffusion (QWI) effect, will result in an energy bandgap or emission wavelength shift for the QW layer 206.

Figure 3:
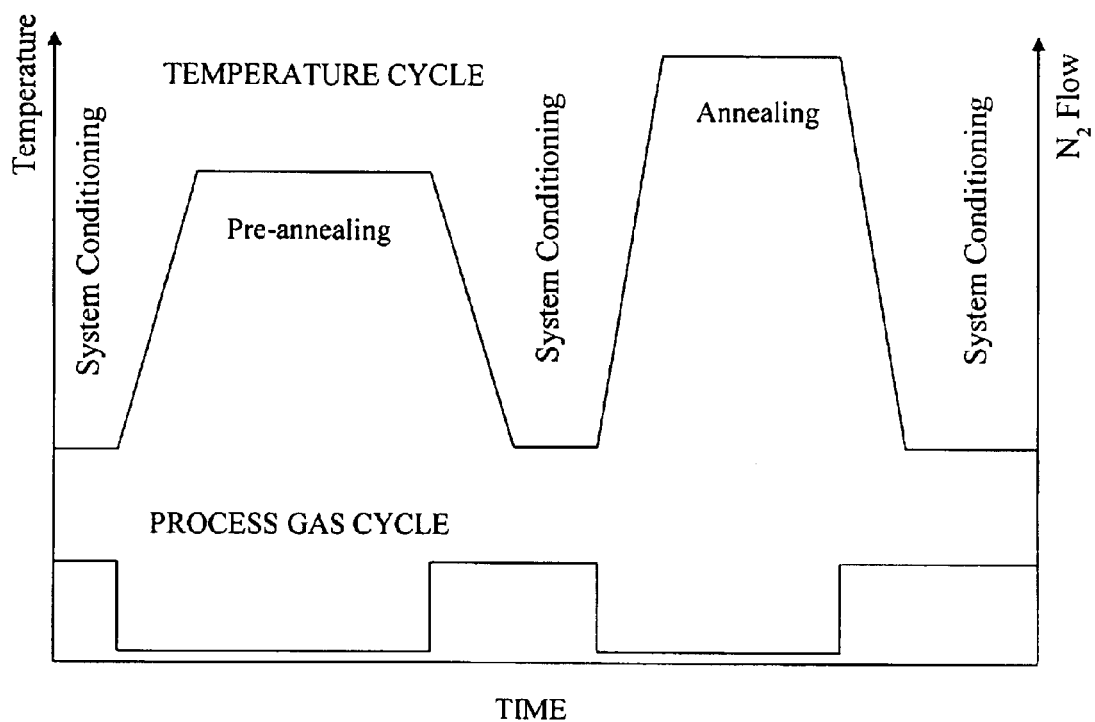
FIG. 3 is a graph that illustrates the temperature and process gas conditions for the pre-annealing and annealing cycles of the present invention.

Preferably, but not necessarily, the QWI anneal stage is carried out using a rapid thermal processor (RTP) to promote the QWI. The pre-annealing and QWI annealing steps can be performed in the same RTP system using a single process cycle as illustrated in FIG. 3. It is well known to those skilled in the art that an RTP includes a chamber filled with halogen lamps that can heat up the quantum well structure very rapidly to a high, constant temperature, which will minimize thermal damage to the quantum well structure due to thermally induced material decomposition and dopants diffusion. RTP can heat the quantum well structure to its anneal temperature in a matter of seconds, while achieving a significant temperature drop by more than 100° C. within a few seconds after the anneal process is completed. It should be understood that while FIG. 3 illustrates a cool-down cycle between the pre-anneal and anneal stages, such a cool-down cycle is not necessarily required. It should be possible with most quantum well structures to simply ramp up the temperature from the pre-anneal temperature to the anneal temperature directly.

The annealing conditions (i.e., time and temperature) must exceed the minimum activation energy in the quantum well structure sufficient to cause quantum well intermixing (QWI) therein, which depends upon material composition and ion implantation. As stated above, these minimum annealing conditions can be experimentally determined by raising the anneal temperature and/or time until a significant shift (i.e., exceeding approximately 20 nm) occurs in the photoluminescence spectra of the quantum well structure, which indicates that the bandgap energy of the quantum well layer has been increased through QWI. While the annealing temperature for QWI is higher than the pre-annealing temperature, the annealing temperature should not exceed a critical annealing temperature that thermally damages the material. This critical annealing temperature can be experimentally determined for any particular quantum well structure by increasing the anneal temperature on un-implanted samples of the quantum well structure until a significant photoluminescence spectra shift is observed (i.e., 50 nm), which indicates that thermal damage has occurred. For most quantum well structures, the preferable QWI anneal temperature is approximately 675–750° C., for several minutes. The preferred purge gas for the RTP system is nitrogen (N2), and the sample is annealed under a Group V overpressure ambient (e.g., arsenic).

PROCESS EXAMPLES

Figure 4:
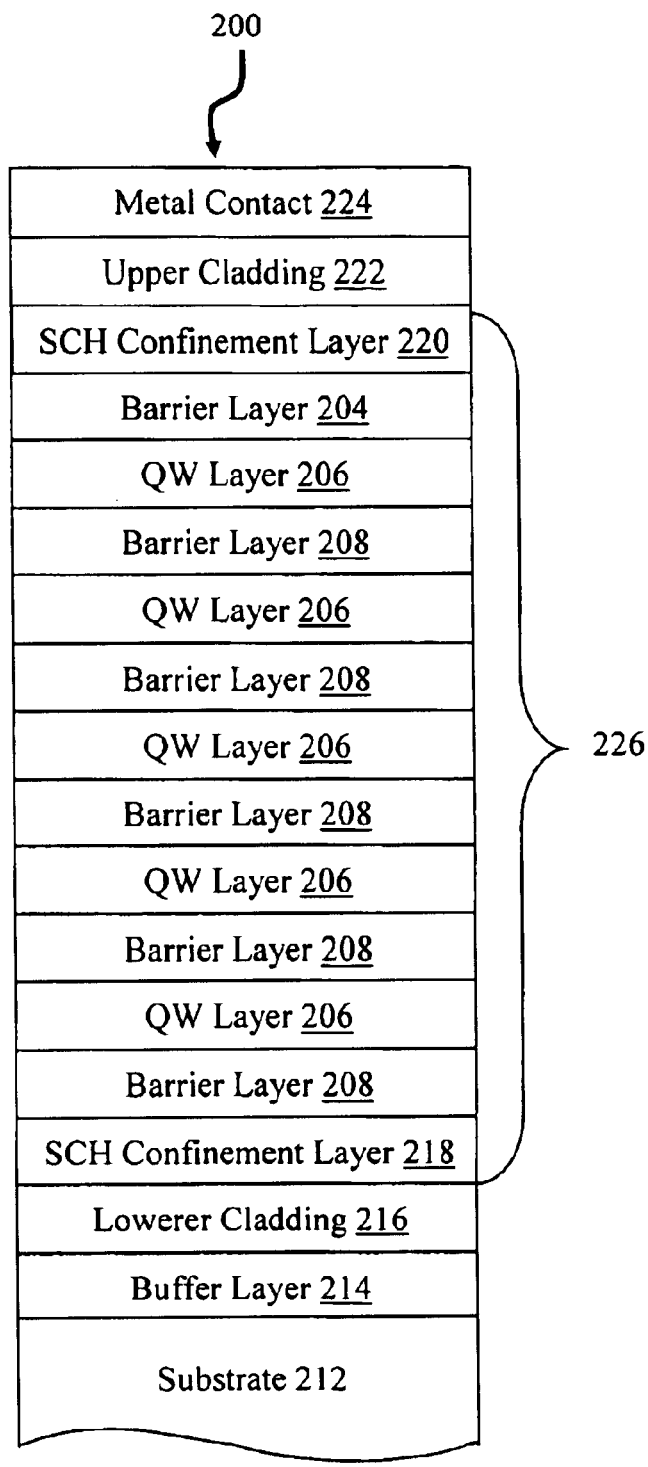
FIG. 4 is a cross-sectional view illustrating the wafer layer structure used in the first and second exemplary processes of the present invention.

The following are examples of the fabrication of 2-bandgap and multiple-bandgap semiconductor devices according to the present invention. The following examples include process parameters such as layer composition and thickness, and well as anneal temperature and times. These parameter values are provided as examples only, and should not be deemed to limit the scope of the present invention. The example quantum well structure 200 used in these exemplary processes is shown in FIG. 4 and in the following table:

| Element Number | Thickness (Å) | Material | Dopant | Concentration (cm$^{-3}$) | Remark |
|---|---|---|---|---|---|
| 224 | 1000 | $In_{0.53}Ga_{0.47}As$ | Zinc | p = 2 × 10$^{19}$ | Metal Contact |
| 222 | 14000 | InP | Zinc | p = 5 × 10$^{17}$ | Upper cladding |
| 220 | 700 | $Ga_xIn_{1-x}As_yP_{1-y}$ ($\lambda_g$ = 1.18 μm) lattice matched | — | Intrinsic | Upper SCH Confinement Layer |
| 204 | 140 | $Ga_{0.54}In_{0.46}As$ (tensile strained) | — | Intrinsic | Core 226, which includes five |
| 206 | 67 × 5 | $Ga_{0.2}In_{0.8}As_{0.7}P_{0.3}$ (compressive strained) | — | Intrinsic | $Ga_{0.2}In_{0.8}As_{0.7}P_{0.3}$ quantum well |
| 208 | 140 × 5 | $Ga_{0.54}In_{0.46}As$ (tensile strained) | — | Intrinsic | layers separated by six $Ga_{0.54}In_{0.46}As$ barrier layers |
| 218 | 700 | $Ga_xIn_{1-x}As_yP_{1-y}$ ($\lambda_g$ = 1.18 μm) lattice matched | Silicon | n = 5 × 10$^{17}$ | Lower SCH Confinement Layer |
| 216 | 10000 | InP | Silicon | n = 2 × 10$^{18}$ | Lower cladding |
| 214 | 5000 | InP | Silicon | n = 4 × 10$^{18}$ | Buffer |
| 212 | — | InP | Sulfur | n = 4 × 10$^{18}$ | Substrate |

This quantum well structure 200 has a quantum well core 226 that includes layers 220/204/206/208/218. Between the pair of separate confinement heterostructure (SCH) layers 218/220, there are five compressively strained $Ga_{0.2}In_{0.8}As_{0.7}P_{0.3}$ quantum well layers 206 separated by six tensile strained $Ga_{0.54}In_{0.46}As$ barrier layers 204/208. The strain of these multiple quantum wells and barriers are balanced to minimize polarization dependency of the structure. The quantum well layers 206 are active layers that can emit or absorb light energy. By providing a plurality of quantum well layers 206, the optical mode of the light passing therethrough can be expanded. The peak emission wavelength of the active quantum well layers 206, measured from photoluminescence at room temperature, is approximately 1.526 µm. The quantum well and barrier layers 204/206/208 are sandwiched between two 700 Å thick lattice matched $Ga_xIn_{1-x}As_yP_{1-y}$ ($\lambda_g$=1.18 µm) SCH guiding layers 220 and 218. As is well known to those skilled in the art, for the lattice-matched III-V quaternary alloy $In_xGa_{1-x}As_yP_{1-y}$, x and y are completely specified by the alloy's bandgap wavelength. Hence, the bandgap wavelength has been used to specify the composition of SCH guiding layers 218/220.

The buffer layer 214 is used to provide a better quality material on which to form the QW structure. The above-described quantum well core 226 is sandwiched between two cladding layers 222 and 216. The thickness of the lower cladding layer 216 is 1 µm and that of the upper cladding layer 222 is 1.4 µm.

The upper SCH guiding layer 220 is preferably left undoped and the lower SCH guiding layer 218 is n-doped with Si to a dopant concentration of $n=5\times10^{17}$ $cm^{-3}$. The lower cladding layer 216 is n-doped with a dopant concentration of $n=2\times10^{18}$ $cm^{-3}$ and the upper cladding layer 222 is p-doped with a dopant concentration of $p=5\times10^{17}$ $cm^{-3}$. The contact layer 224 is formed of a $p^+$-type 0.1 µm $In_{0.53}Ga_{0.47}As$ contact layer (e.g., $2\times10^{19}$ $cm^{-3}$). Silicon is used as the n-dopant and zinc as the p-dopant.

The quantum well core 226, cladding layers 216/222, buffer layer 214 and contact layer 224 are formed on a (100)-oriented $n^+$-type S-doped InP substrate with an etch pit density of less than 500 $cm^{-2}$ using metal-organic chemical vapor deposition (MOCVD).

Example 1

2-Bandgap Semiconductor Chip

Figure 5A:
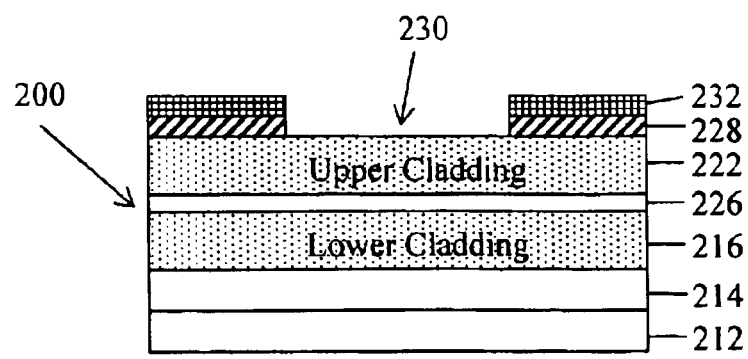
FIG. 5A is a cross sectional view of the exemplary quantum well structure having an implant mask with an ion implant window formed therein.
Figure 5B:
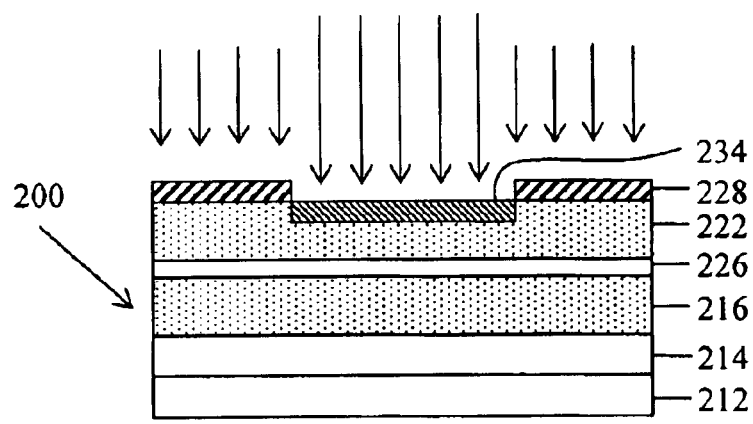
FIG. 5B is a cross sectional view of the quantum well structure illustrating the implant region formed by the ion implantation process.
Figure 5C:
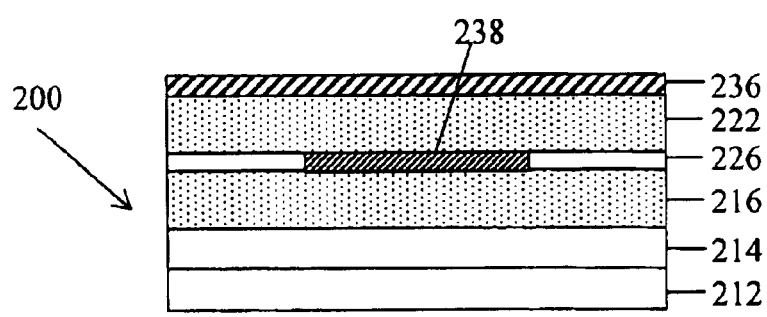
FIG. 5C is a cross sectional view of the quantum well structure showing the intermixed region of the quantum well core.

FIGS. 5A–5C illustrate a process for the fabrication of a 2-bandgap semiconductor device. The process begins after the quantum well structure 200 shown in FIG. 4 has been formed. An implant masking layer 228 (e.g., 1000 nm of $SiO_2$) is first deposited on the QW structure 200. Selective bandgap tuning windows 230 are formed in the masking layer 228 using a standard lithography process (photolithography or e-beam lithography, etc). Specifically, a photo-resist layer 232 is formed over the masking layer 228, where portions of the photo resist layer 232 are then removed from the regions in which the windows 230 are to be formed, leaving portions of the masking layer 228 exposed. Wet or dry $SiO_2$ etching techniques are then used to remove the exposed portions of the masking layer 228, leaving windows 230 formed in the masking layer 228 that expose portions of the underlying QW structure 200, as illustrated in FIG. 5A. The remainder of the structure includes substrate 212, buffer layer 214, upper and lower cladding layers 216, 222, and quantum well core 226.

After the photo resist 232 is removed, point defects and impurity are introduced into those portions of upper cladding layer 222 that are exposed by windows 230 by ion-implantation. While not shown, the implant energy can be increased so that the ions also penetrate into, and create point defects in, any of the quantum well core layers 226, and possibly even down to substrate 212. Example ion implant energies are 200 keV to 700 keV, and dosages of $10^{12}$ $cm^{-2}$ to $10^{15}$ $cm^{-2}$. However, higher implant energies tend to damage the quantum well layers and form point defect complexes and clusters, resulting in higher optical losses in the finished device. Thus, it is preferred, but not necessary, to limit the ion implant energy to penetrate only down into the cladding layer 222 as shown in the FIG. 5B. To ion implant the cladding layer as shown in FIG. 5B, the implantation is carried out with a 360 keV implantation energy and a $10^{14}$ $cm^{-2}$ dosage, at a temperature of 200° C., using doubly charged phosphorous (P). With relatively low implant energy, this ion implantation process forms an implant region 234 in just the upper cladding layer 222 in which the point defects and impurity are formed, as illustrated in FIG. 5B.

The $SiO_2$ implant mask 228 is then removed, and a cap layer 236 (e.g., of $SiO_2$) is then formed over the entire structure (e.g., using plasma-enhanced chemical vapor deposition—PECVD). This cap layer will act as an annealing cap during the high temperature annealing process.

A pre-annealing thermal process is next performed on the quantum well structure 200, which can be carried out, for example, in a diffusion furnace or a rapid thermal processor (RTP). This pre-annealing cycle is performed for 10 minutes at 600° C., which is below the anneal conditions necessary to trigger QWI in the exemplary quantum well structure 200.

An annealing thermal process follows to initiate QWI in the quantum well core 226, preferably using the same diffusion furnace or RTP. To reduce the outdiffusion of group V elements, the QW structure is annealed under an As overpressure ambient by sandwiching the structure between two pieces of GaAs wafer. This annealing process is conducted at a temperature exceeding 700° C. for 2 or 3 minutes.

FIG. 5C illustrates the resulting QW structure after QWI. The QW core 226 now includes an intermixed region 238 in which the bandgap energy of the QW layer 206 portion therein is greater than other portions of the QW layer 206. The bandgap energy of the QW core 226 portions masked from the ion implantation remains the same as originally formed. The resulting structure provides a route for integrating other photonic components onto a single chip.

Figure 6:
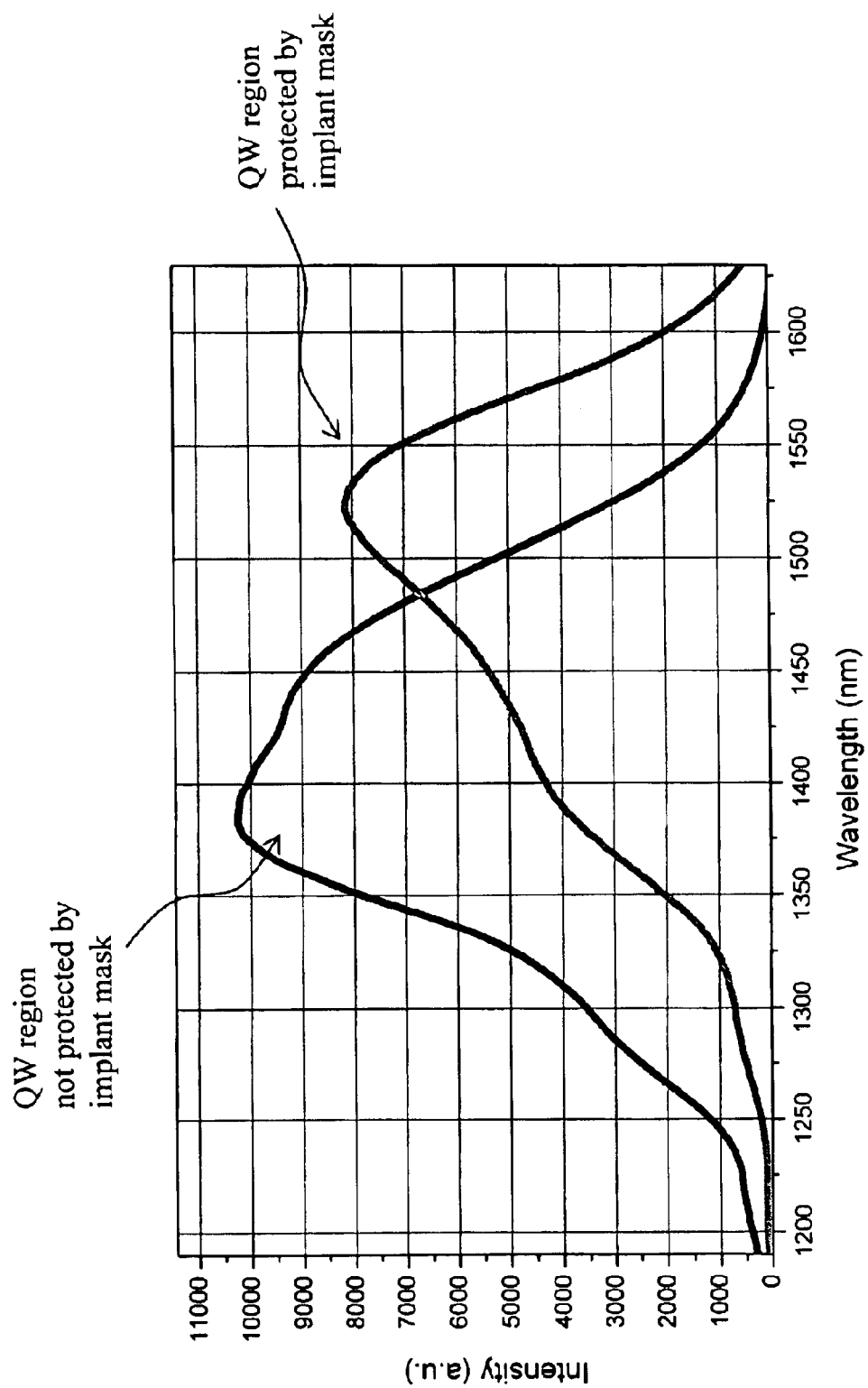
FIG. 6 is a graph showing the photoluminescence spectra for the quantum well core regions subjected to QWI and protected from QWI.

The exemplary two-wavelength chip has been fabricated using the above-described process conditions. The room temperature photoluminescence (PL) spectra for the two-wavelength chip are given in FIG. 6. The QW structure regions protected by the 1 µm $SiO_2$ implant mask 228 have a peak transmission wavelength of about 1520 nm in the QW layer 206, which constitutes a negligible bandgap shift compared to the originally grown As material. In contrast, the QW structure regions left unprotected by mask 228 (i.e., intermixed region 238) exhibit a peak transmission wavelength of about 1380 nm in the QW layer 206, which is a shift of ~140 nm.

Example 2

Multiple-Bandgap Engineering Process

A multiple bandgap tuning technique is next illustrated, which is similar to the process used in the example above, but it fabricates a triple bandgap quantum well chip. In this example, depicted in FIGS. 7A and 7B, the patterned implant mask 228 (e.g., $SiO_2$) is formed not only with window regions 230 in which the mask material is completely removed, but also with semi window regions 240 in which the mask material is partially removed with varying thicknesses, where the thicknesses allow varying degrees of the ions to penetrate therethrough into the underlying cladding layer 222. The manufacturing of the $SiO_2$ implantation mask with different thicknesses can be achieved using a single or a multiple step lithography/etch process. For example, the implant mask layer 228 is first coated with a layer of photo resist, and a photolithography/etch process (wet or dry) is used to define window regions 230 in which the mask material is removed to exposed the underlying structure in which the bandgap is to be tuned the most (e-beam lithography can also be used). The above described lithography and the etching processes are repeated to define the semi window regions 240, however the etch processes are controlled to remove only some of the mask layer material, leaving mask material of different thicknesses at different selected window regions 240.

Figure 7A:
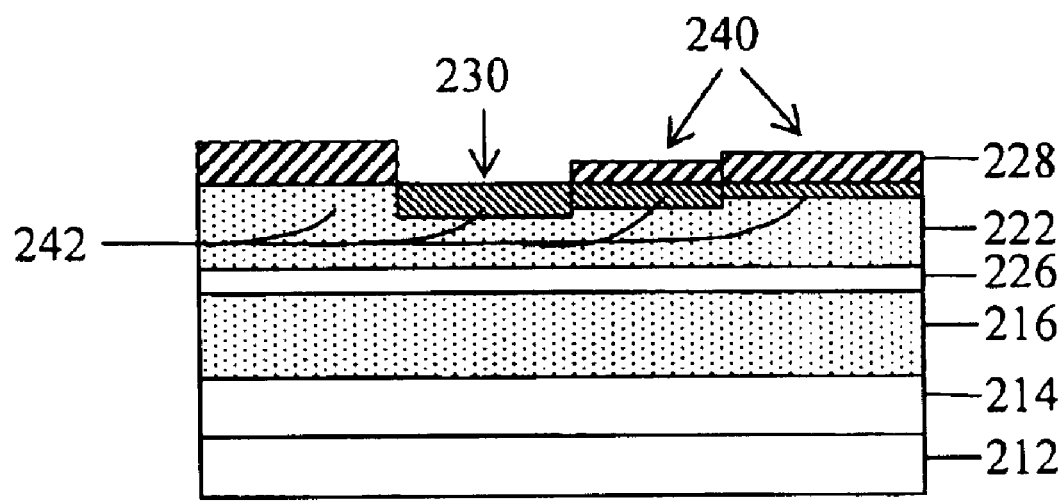
FIG. 7A is a cross sectional view of the quantum well structure illustrating different doses of impurity in the cladding material achieved using a single ion-implantation step.

Similar to Example 1, the ion implantation step is performed after the window regions 230/240 are formed in the mask layer 228. FIG. 7A gives a schematic illustration of the ion implantation step with 4 different thicknesses of the implant mask 228. The four different mask thicknesses result in four different concentrations of point defects 242 in upper cladding layer 222 from the single ion implantation process through the patterned implant mask 228. As the degree of QWI is dependent on the implantation dose, multiple bandgap energies across a wafer will be achieved.

Figure 7B:
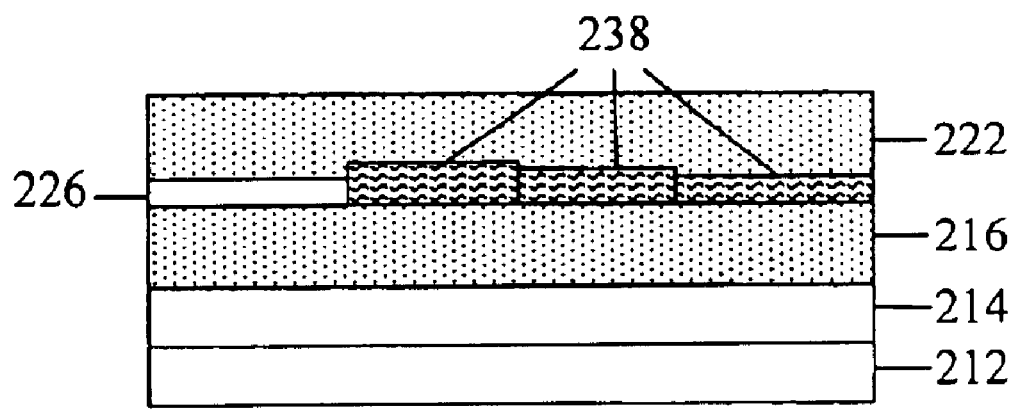
FIG. 7B is a cross sectional view of the quantum well structure showing different intermixed regions with different bandgap energies resulting from QWI.

The masking layer 228 is removed after the ion-implantation. An annealing cap layer 236 (e.g., $SiO_2$) is then deposited on the structure. The same pre-annealing and annealing thermal processes as described above with respect to Example 1 are performed to result in (QWI) intermixed regions 238 as illustrated in FIG. 7B. These intermixed regions (and the portions of the QW structure not implanted with ions) all have different bandgap energies as the result of the different implantation dosages from the ion implantation process.

Figure 8:
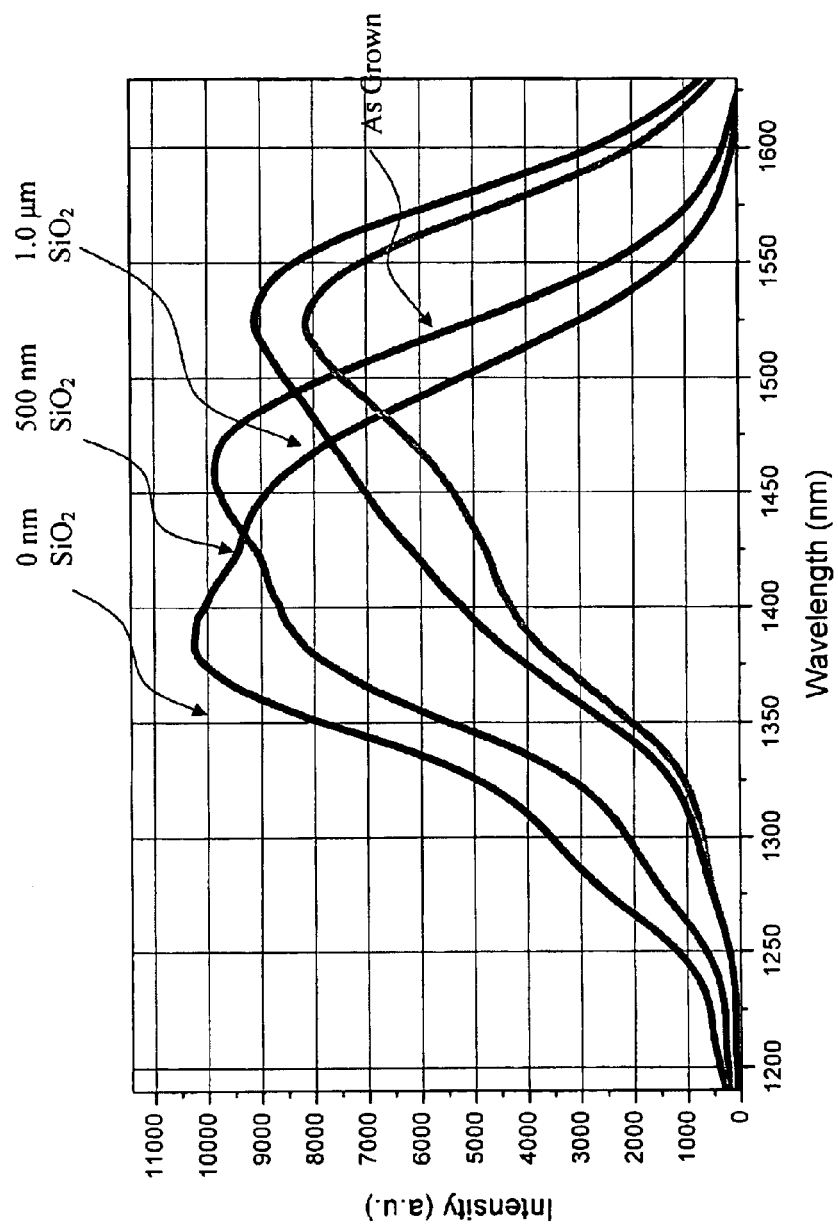
FIG. 8 is a graph showing the photoluminescence spectra for different regions of the quantum well core subjected to varying degrees of QWI.

FIG. 8 illustrates room temperature photoluminescence (PL) spectra from an actual quantum well structure implanted with ions using an implant mask with the following window thicknesses: 1 μm, 500 nm, 0 nm (i.e., masking material completely removed), as well as a non ion-implanted (As grown) quantum well structure. The implantation is carried out with a 360 keV implantation energy and a $10^{14}$ $cm^{-2}$ dosage, at a temperature of 200° C., using doubly charged phosphorous (P). FIG. 8 shows that the quantum well region masked with 1 μm thick ion mask material shows a negligible wavelength shift compared to an originally As-grown quantum well region, at about 1520 nm. However, quantum well regions masked with 500 nm and 0 nm of masking material exhibited peak transmissions at about 1460 nm and 1380 nm, representing a wavelength shift of 60 nm and 140 nm, respectively.

Figure 9:
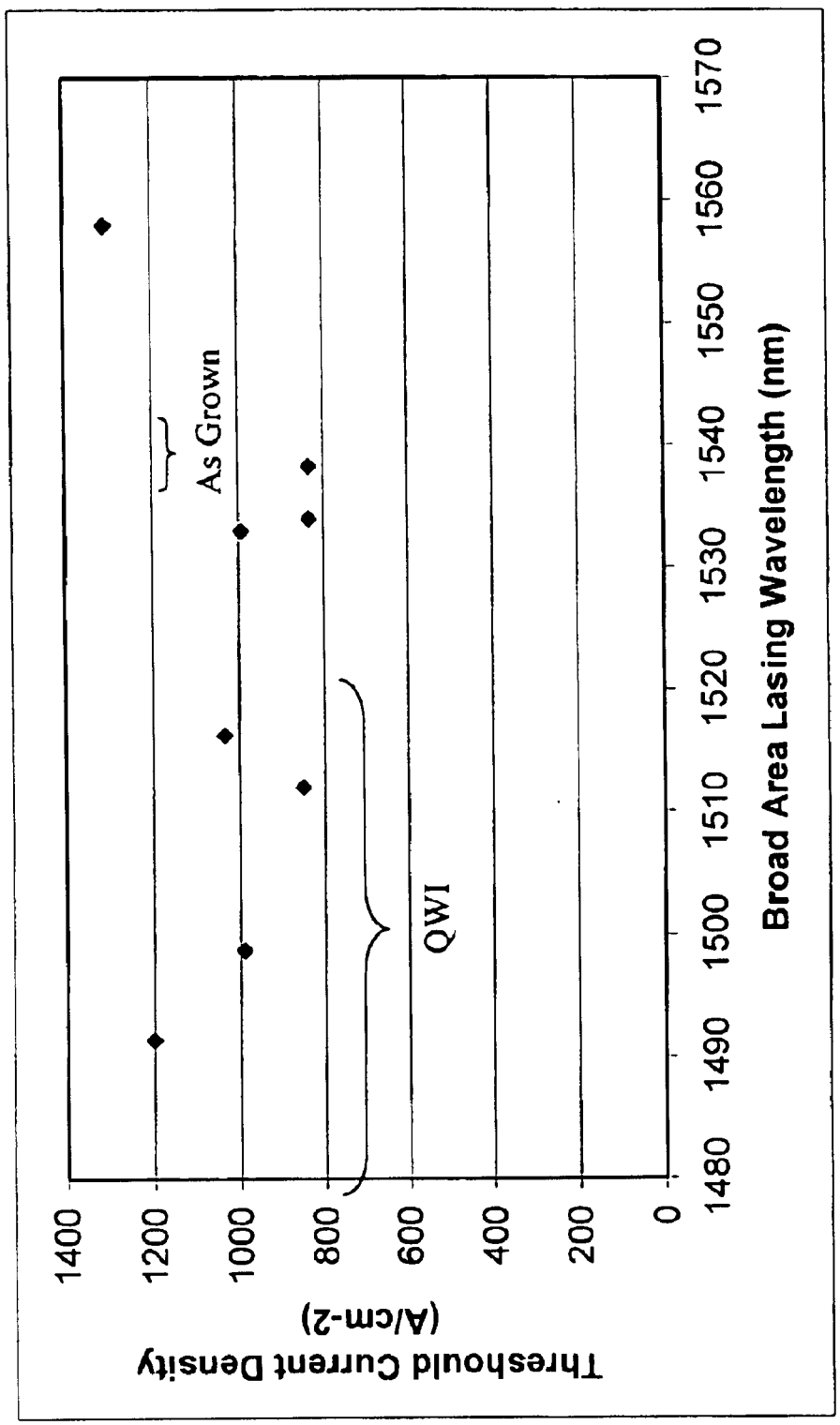
FIG. 9 is a graph showing the threshold current densities versus wavelengths for quantum well structures subjected to different degrees of QWI.

Wavelength shifted broad area gain-guided fabry-perot lasers have been fabricated both on As-grown materials and bandgap shifted materials according to the present invention. The threshold currents of these lasers were measured under pulsed current pumping conditions. The current densities of these lasers are plotted in FIG. 9. The As-grown lasers lased at about 1556 nm and exhibited a threshold current density of about 1.3 $kA/cm^2$, whereas the threshold current densities of the (QWI) intermixed devices (which produce light at shorter wavelengths) are lower than that of the As-grown lasers. These results indicate that the quality of the material forming the lasers improves after QWI. The grown-in defects of the starting materials might be out-annealing during the RTP cycle, hence resulting in improved quality of the intermixed materials.

It is to be understood that the present invention is not limited to the embodiment(s) described above and illustrated herein. For example, while the figures show an upper cladding layer 202 formed over the upper barrier layer 204, this cladding layer can be omitted, with or without being replaced by other quantum well structure layers. The ion implantation of the present invention forms point defects in any quantum well structure layer, whereby point defects are brought closer to the quantum well layer 206 by the pre-anneal process, and QWI is performed by the anneal process. The present invention equally applies to semiconductor devices having multiple stacked or unstacked quantum well layers.

Any other undisclosed or incidental details of the construction or composition of the various elements of the disclosed embodiment of the present invention are not believed to be critical to the achievement of the advantages of the present invention, so long as the elements possess the attributes needed for them to perform as disclosed. The selection of these and other details of construction are believed to be well within the ability of even one of having ordinary skill in this area, in view of the present disclosure.

Illustrative embodiments of the present invention have been described in considerable detail for the purpose of disclosing a practical, operative structure whereby the invention may be practiced advantageously. The designs described herein are intended to be exemplary only. The novel characteristics of the invention may be incorporated in other structural forms without departing from the spirit and scope of the invention. The invention encompasses embodiments both comprising and consisting of the elements described herein with reference to the illustrative embodiments. It is therefore intended that the foregoing detailed description be regarded as illustrative rather than limiting, and that it is desired to protect all variations and modifications within the valid scope of the present invention. It is intended that the scope and spirit of the invention be defined by the following claims, including all equivalents.

What is claimed is:

1. A method of shifting a bandgap energy of a semiconductor quantum well layer, comprising the steps of:
    introducing ions into a quantum well structure at a first elevated temperature, wherein the quantum well structure comprises a plurality of material layers formed on a semiconductor substrate including a quantum well layer disposed between an upper barrier layer and a lower barrier layer;
    thermally pre-annealing the quantum well structure at a second elevated temperature and for a pre-anneal time period that do not induce quantum well intermixing in the quantum well structure, wherein the introduction of the ions creates point defects in the quantum well structure, wherein the thermal pre-annealing moves the point defects closer to the quantum well layer without inducing quantum well intermixing in the quantum well layer; and
    thermally annealing the quantum well structure at a third elevated temperature and for an anneal time period sufficient to induce quantum well intermixing in, and a shifting of a bandgap energy of, the quantum well layer.

2. The method of claim 1, wherein the quantum well structure further includes an upper cladding layer disposed over the upper barrier layer, and wherein the introduction of ions into the quantum well structure includes introducing the ions into the cladding layer.

3. The method of claim 2, wherein the quantum well structure further includes a plurality of quantum well layers separated by a plurality of barrier layers.

4. The method of claim 1, wherein the first elevated temperature is at least approximately 200° C., but does not exceed a temperature that causes thermal decomposition of the quantum well structure.

5. The method of claim 1, wherein the second elevated temperature is between approximately 300° C. and 650° C.

6. The method of claim 1, wherein the third elevated temperature is greater than the second elevated temperature.

7. The method of claim 6, wherein the third elevated temperature is between approximately 675° C. and 750° C.

8. The method of claim 1, wherein the ions introduced into the quantum well structure are at least one of arsenic ions, phosphorous ions, argon ions, xenon ions, oxygen ions and gallium ions.

9. The method of claim 8, wherein the introduction of ions is performed with an implant energy no greater than approximately 360 keV and a dosage no greater than approximately $10^{14}$ cm$^{-2}$.

10. The method of claim 1, further comprising the step of forming a capping layer of material over the quantum well structure after the introduction of the ions.

11. The method of claim 1, wherein the introduction of the ions is performed only on one or more selected portions of the quantum well structure.

12. The method of claim 11, further comprising the step of forming a patterned mask layer over the quantum well structure for selectively blocking at least some of the ions from being introduced into portions of the quantum well structure.

13. The method of claim 12, wherein the patterned mask layer is formed of a material having a thermal coefficient of expansion that is significantly greater than that of the quantum well structure.

14. The method of claim 12, wherein the formation of the patterned mask layer includes the steps of forming a masking material over the quantum well structure having a thickness sufficient to block the ions from being introduced into the quantum well structure, and selectively removing portions of the masking material to form window regions in the mask layer through which at least some of the ions can pass and be introduced into the quantum well structure.

15. The method of claim 14, wherein thicknesses of the masking material in the window regions vary to allow varying amounts of the ions to pass therethrough and be introduced into the quantum well structure.

16. The method of claim 15, wherein for at least one of the window regions, all the masking material is removed so that the one window region does not block ion incident thereon.

17. The method of claim 1, wherein the annealing step is carried out with an overpressure of a Group V material.

18. The method of claim 1, wherein the annealing step is carried out with an overpressure of arsenic.

19. A method of making a multiple bandgap semiconductor device, comprising the steps of:
forming a quantum well structure, wherein the quantum well structure comprises a plurality of epitaxial layers disposed over a substrate including a quantum well layer disposed between upper and lower barrier layers;
forming a patterned mask over the quantum well structure with sufficient thickness to block ions incident thereon, wherein the patterned mask includes a plurality of window portions of reduced thickness for passing therethrough at least some ions incident thereon;
heating the quantum well structure to a first elevated temperature;
bombarding the patterned mask with ions, wherein at least some of the ions incident on the window portions pass therethrough and are introduced into the heated quantum well structure;
thermally pre-annealing the quantum well structure at a second elevated temperature and for a pre-annealing time period that do not induce quantum well intermixing in the quantum well structure, wherein the introduction of the ions creates point defects in the quantum well structure, wherein the thermal pre-annealing moves point defects closer to the quantum well layer without inducing quantum well intermixing in the quantum well layer; and
thermally annealing the quantum well structure at a third elevated temperature greater than the second elevated temperature, and for an anneal time period, sufficient to induce quantum well intermixing in, and a shifting of a bandgap energy of, the quantum well layer.

20. The method of claim 19, wherein the formation of the quantum well structure further comprises the step of forming an upper cladding layer over the upper barrier layer, wherein the ions are introduced into the cladding layer.

21. The method of claim 20, wherein the formation of the quantum well structure further comprises the step of forming a plurality of quantum well layers separated by a plurality of barrier layers.

22. The method of claim 19, wherein the first elevated temperature is at least 200° C., but does not exceed a temperature that causes thermal decomposition of the quantum well structure.

23. The method of claim 19, wherein the second elevated temperature is between 300° C. and 650° C.

24. The method of claim 19, wherein the third elevated temperature is between 675° C. and 750° C.

25. The method of claim 19, wherein the ions introduced into the quantum well structure are at least one of arsenic ions, phosphorous ions, argon ions, xenon ions, oxygen ions and gallium ions.

26. The method of claim 25, wherein the bombardment of ions is performed with an implant energy no greater than 360 keV and a dosage no greater than $10^{14}$ cm$^{-2}$.

27. The method of claim 17, further comprising the step of forming a capping layer of material over the quantum well structure after the introduction of the ions, wherein the capping layer reduces outdiffusion of elements of the quantum well structure.

28. The method of claim 19, wherein the patterned mask is formed of a material having a thermal coefficient of expansion that is significantly greater than that of the quantum well structure.

29. The method of claim 19, wherein the formation of the patterned mask includes the steps of:
forming a masking material over the quantum well structure having a thickness sufficient to block the ions from being introduced into the quantum well structure; and
selectively removing portions of the masking material to form the window regions in the mask.

30. The method of claim 29, wherein the thicknesses of the masking material in the window regions vary to allow varying amounts of the ions to pass therethrough and be introduced into the quantum well structure.

31. The method of claim 30, wherein for at least one of the window regions, all the masking material is removed so that the one window region does not block ions incident thereon.

32. The method of claim 17, wherein the annealing step is carried out with an overpressure of a Group V material.

33. The method of claim 17, wherein the annealing step is carried out with an overpressure of arsenic.

* * * * *